United States Patent
Omori et al.

(10) Patent No.: US 10,679,874 B2
(45) Date of Patent: Jun. 9, 2020

(54) LIGHT IRRADIATION TYPE HEAT TREATMENT APPARATUS AND HEAT TREATMENT METHOD

(71) Applicant: SCREEN HOLDINGS CO., LTD., Kyoto-shi, Kyoto (JP)

(72) Inventors: Mao Omori, Kyoto (JP); Katsuichi Akiyoshi, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

(21) Appl. No.: 16/048,020

(22) Filed: Jul. 27, 2018

(65) Prior Publication Data
US 2019/0067051 A1 Feb. 28, 2019

(30) Foreign Application Priority Data

Aug. 30, 2017 (JP) ................................. 2017-165339

(51) Int. Cl.
*H01L 21/67* (2006.01)
*H01L 21/687* (2006.01)
*H01L 21/02* (2006.01)

(52) U.S. Cl.
CPC .. *H01L 21/67115* (2013.01); *H01L 21/02345* (2013.01); *H01L 21/67017* (2013.01);
(Continued)

(58) Field of Classification Search
CPC ......... H01L 21/67115; H01L 21/67253; H01L 21/6878
See application file for complete search history.

(56) References Cited

U.S. PATENT DOCUMENTS

| 5,365,772 A | 11/1994 | Ueda et al. |
| 2002/0073925 A1* | 6/2002 | Noble ................... C23C 8/36 |
| | | 118/723 ME |

(Continued)

FOREIGN PATENT DOCUMENTS

| JP | S62-108843 U | 7/1987 |
| JP | 06-029229 A | 2/1994 |

(Continued)

OTHER PUBLICATIONS

Taiwanese Office Action issued in corresponding Taiwanese Patent Application No. 107120296, dated Apr. 15, 2019, with English translation of the Japanese translation of the Taiwanese Office Action.

(Continued)

*Primary Examiner* — Dale E Page
*Assistant Examiner* — Quovaunda Jefferson
(74) *Attorney, Agent, or Firm* — McDermott Will & Emery LLP

(57) ABSTRACT

Pressure in a chamber receiving a semiconductor wafer is reduced to a level less than atmospheric pressure. The semiconductor wafer is subjected to heat treatment in a reduced-pressure atmosphere by being irradiated with a flash of light. A leak determination part determines that a leak occurs at the chamber if pressure in the chamber does not reach target pressure while a time period passed since start of reduction of pressure in the chamber exceeds a threshold set in advance. A leak at the chamber is detected by monitoring a time period passed since start of reduction of pressure in the chamber. This makes it possible to determine the presence or absence of a leak at the chamber with a simple structure without requiring installation of a new hardware structure.

2 Claims, 9 Drawing Sheets

(52) U.S. Cl.
CPC .... *H01L 21/67253* (2013.01); *H01L 21/6875* (2013.01); *H01L 21/68707* (2013.01); *H01L 21/68785* (2013.01)

(56) References Cited

U.S. PATENT DOCUMENTS

| | | |
|---|---|---|
| 2002/0117634 A1 | 8/2002 | Wilcox et al. |
| 2002/0179010 A1 | 12/2002 | Otoshi et al. |
| 2006/0168844 A1* | 8/2006 | Edamura ............ G05D 16/2066 34/559 |
| 2006/0236559 A1 | 10/2006 | Mori |
| 2011/0139265 A1 | 6/2011 | Grobler et al. |
| 2013/0206747 A1* | 8/2013 | Nishide ................ H05B 3/0047 219/538 |
| 2017/0062249 A1 | 3/2017 | Aoyama et al. |

FOREIGN PATENT DOCUMENTS

| | | |
|---|---|---|
| JP | 09-280995 A | 10/1997 |
| JP | 2005-217063 A | 8/2005 |
| JP | 2006-210728 A | 8/2006 |
| JP | 2008-021732 A | 1/2008 |
| JP | 2009-117554 A | 5/2009 |
| JP | 2017-045982 A | 3/2017 |
| JP | 2017-092095 A | 5/2017 |
| KR | 10-2005-0068821 A | 7/2005 |

OTHER PUBLICATIONS

Korean Notification of Reason for Refusal issued in corresponding Korean Patent Application No. 10-2018-0086551, dated Dec. 12, 2019, with English translation.

* cited by examiner

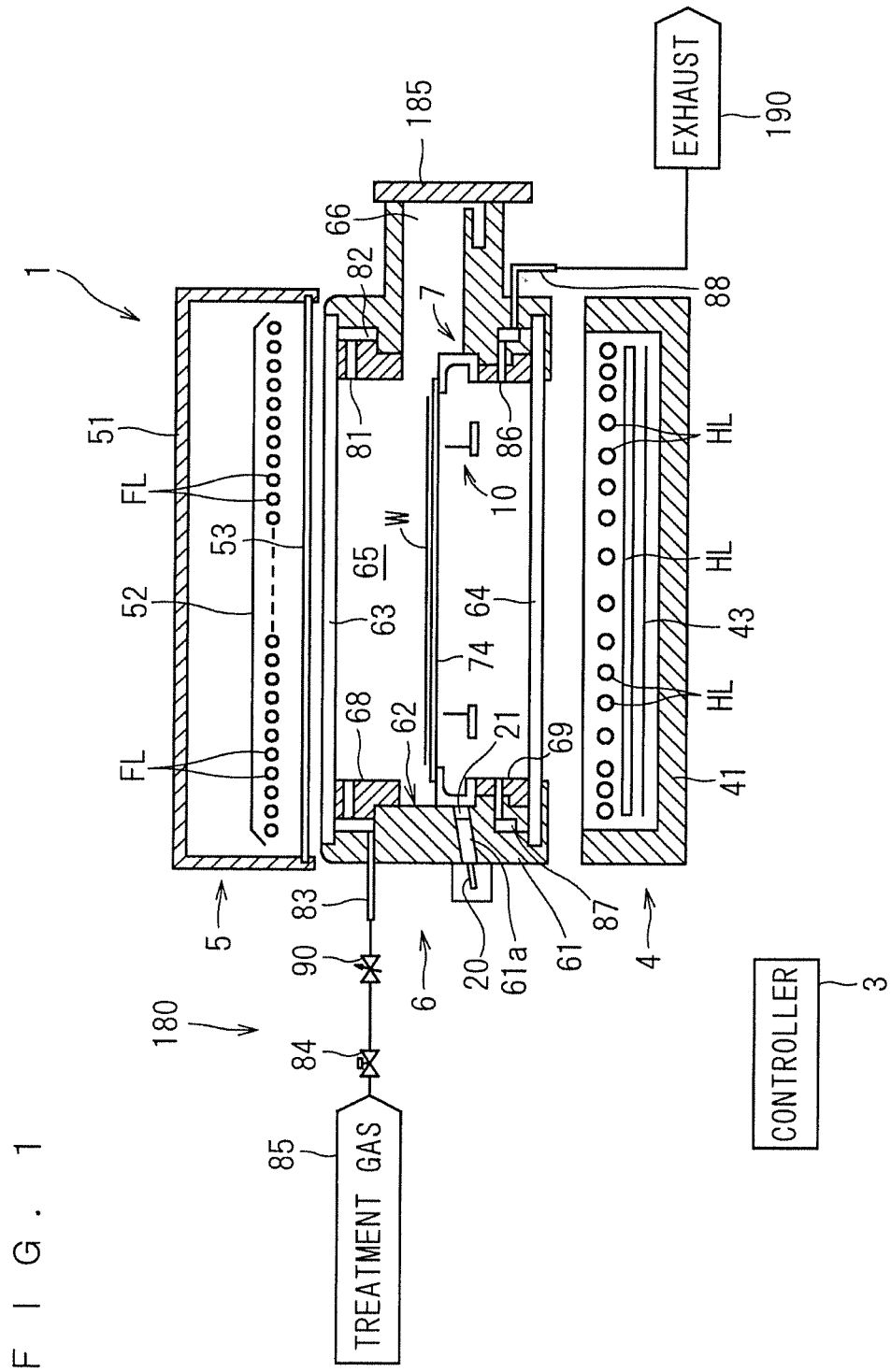
F I G . 1

F I G . 4
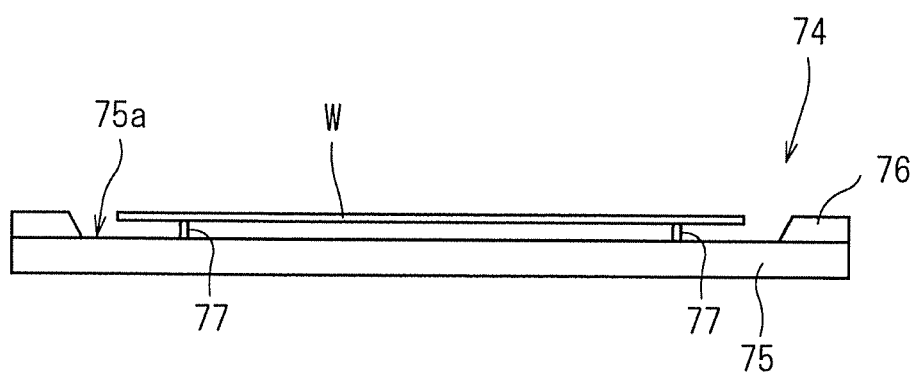

F I G. 5
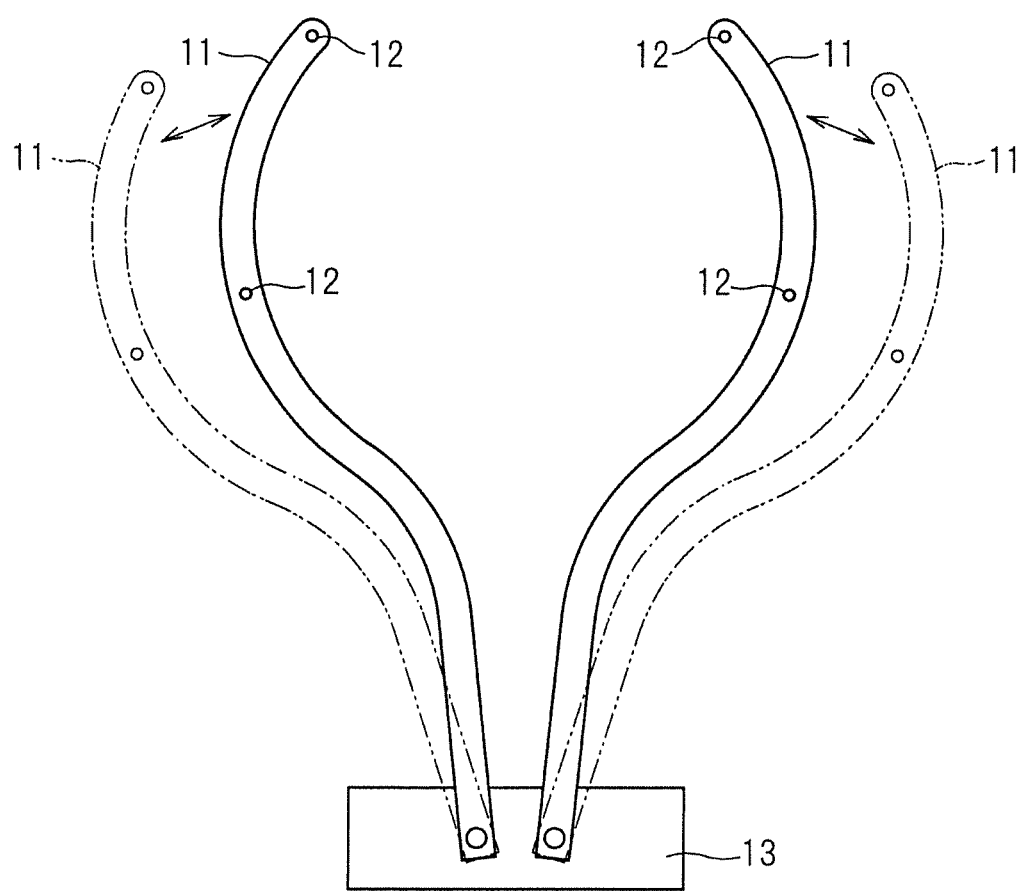

F I G . 6
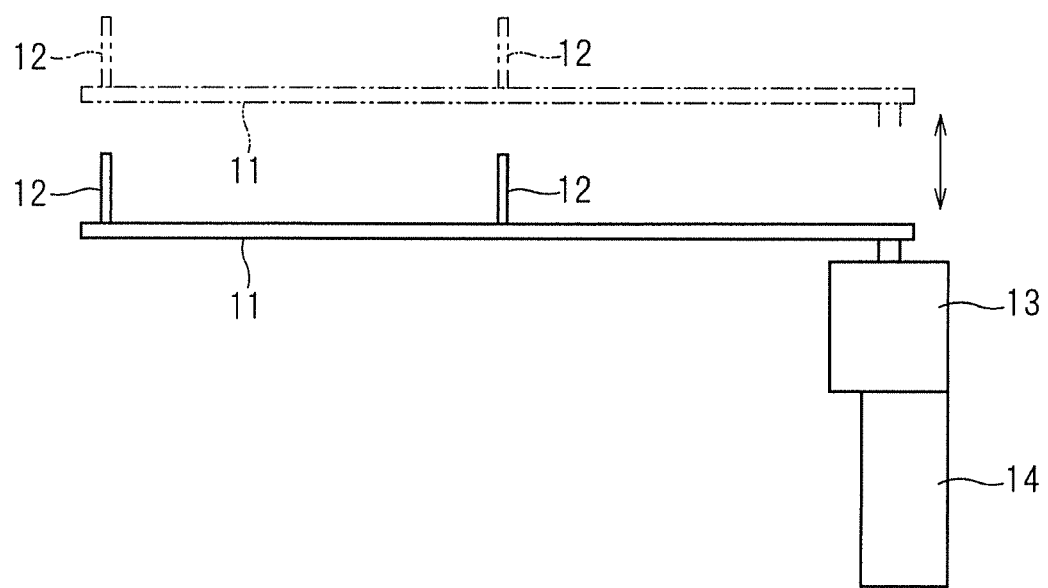

LIGHT IRRADIATION TYPE HEAT TREATMENT APPARATUS AND HEAT TREATMENT METHOD

BACKGROUND OF THE INVENTION

Field of the Invention

The present invention relates to a heat treatment apparatus and a heat treatment method for irradiating a thin plate-like precision electronic substrate (hereinafter referred to simply as a "substrate") such as a semiconductor wafer with light to heat the substrate.

Description of the Background Art

In the process of manufacturing a semiconductor device, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for treatment requiring heating in an extremely short period of time, typically, activation of impurities implanted into a semiconductor wafer. Irradiating a surface of the semiconductor wafer with impurities implanted by ion implantation process with a flash of light emitted from a flash lamp allows temperature rise of the surface of the semiconductor wafer to an activation temperature only for an extremely short period of time. This allows only activation of the impurities without causing deep diffusion of the impurities.

An attempt has also been made to perform the flash lamp annealing in an atmosphere of reactive gas such as ammonia. For example, US 2017/0062249 discloses post deposition annealing on a high dielectric constant gate insulator film (high-k film). In this heat treatment, while the interior of a chamber housing a semiconductor wafer with the deposited high dielectric constant gate insulator film is maintained in a reduced-pressure state, an ammonia atmosphere is formed and the semiconductor wafer is heated by being irradiated with a flash of light. The high dielectric constant gate insulator film has been developed further for the purpose of resolving a problem relating to increase in a leak current caused by further reduction of the thickness of a gate insulator film and has been expected to function a new stack configuration of a field-effect transistor together with a metal gate electrode using metal for a gate electrode.

The flash lamp annealer disclosed by US 2017/0062249 reduces pressure in the chamber to about 100 Pa by exhausting the atmosphere in the chamber before reactive gas is supplied into the chamber. Even after the flash heating treatment is finished, pressure in the chamber is still reduced to discharge the reactive gas. Such an apparatus of reducing pressure in the chamber to a level less than atmospheric pressure causes a problem that pressure reduction is disabled by the occurrence of a leak at the chamber. In particular, if reactive gas to be used is harmful gas such as ammonia like in the apparatus disclosed by US 2017/0062249, the occurrence of a leak at the chamber causes a problem of leakage of such reactive gas out of the chamber.

In this regard, determining the presence or absence of a leak at the chamber becomes an important issue. A leak occurs at the chamber of the flash lamp annealer for a reason such as damage of a quartz window at the chamber or trouble at piping for supply and exhaust into and from the chamber, for example. The presence or absence of a leak may be determined by a technique such as installation of a hardware structure such as a sensor for crack detection on the quartz window, for example. However, this may unfortunately interfere with flash of light irradiation.

SUMMARY OF THE INVENTION

The present invention is intended for a heat treatment apparatus for heating a substrate by irradiating the substrate with light.

According to one aspect of the present invention, the heat treatment apparatus comprises: a chamber having a quartz window and for receiving a substrate therein; a light irradiation part for irradiating the substrate housed in the chamber with light through the quartz window; an exhaust part for exhausting an atmosphere in the chamber; a gas supply part for supplying predetermined treatment gas to the chamber; a manometer for measuring pressure in the chamber; and a leak determination part for determining that a leak occurs at the chamber if a measured value obtained by the manometer does not reach target pressure while a time period passed since start of reduction of pressure in the chamber by the exhaust part exceeds a threshold set in advance.

The occurrence of a leak is determined by monitoring a time period passed since start of reduction of pressure. This makes it possible to determine the presence or absence of a leak at the chamber with a simple structure.

According to a different aspect of the present invention, the heat treatment apparatus comprises: a chamber having a quartz window and for receiving a substrate therein; a light irradiation part for irradiating the substrate housed in the chamber with light through the quartz window; an exhaust part for exhausting an atmosphere in the chamber; a gas supply part for supplying predetermined treatment gas to the chamber; a manometer for measuring pressure in the chamber; a pressure adjusting valve for adjusting pressure in the chamber to a set value based on a measured value obtained by the manometer; and a leak determination part for determining that a leak occurs at the chamber if a time period in which a difference between a measured value obtained by the manometer and the set value is a certain value or more exceeds a threshold set in advance after pressure in the chamber is reduced to treatment pressure.

The occurrence of a leak is determined by monitoring pressure deviation occurring during pressure reduction process. This makes it possible to determine the presence or absence of a leak at the chamber with a simple structure.

According to a different aspect of the present invention, the heat treatment apparatus comprises: a chamber having a quartz window and for receiving a substrate therein; a light irradiation part for irradiating the substrate housed in the chamber with light through the quartz window; an exhaust part for exhausting an atmosphere in the chamber; a gas supply part for supplying predetermined treatment gas to the chamber; a manometer for measuring pressure in the chamber; and a leak determination part for determining that a leak occurs at the chamber if a time period required for a measured value obtained by the manometer to reach atmospheric pressure since start of supply of inert gas from the gas supply part to the chamber reduced to predetermined pressure is less than a threshold set in advance.

The occurrence of a leak is determined by monitoring a time period of increase to atmospheric pressure. This makes it possible to determine the presence or absence of a leak at the chamber with a simple structure.

The present invention is further intended for a heat treatment method for heating a substrate by irradiating the substrate with light.

According to one aspect of the present invention, the heat treatment method comprises the steps of: (a) housing the substrate in a chamber having a quartz window; (b) reducing pressure in the chamber to a level less than atmospheric pressure; and (c) irradiating the substrate housed in the chamber with light emitted from a light irradiation part through the quartz window, wherein if pressure in the chamber does not reach target pressure while a time period passed since start of reduction of pressure in the chamber exceeds a threshold set in advance, a leak is determined to occur at the chamber.

The occurrence of a leak is determined by monitoring a time period passed since start of reduction of pressure. This makes it possible to determine the presence or absence of a leak at the chamber with a simple structure.

According to a different aspect of the present invention, the heat treatment method comprises the steps of: (a) housing the substrate in a chamber having a quartz window; (b) reducing pressure in the chamber to a level less than atmospheric pressure; (c) adjusting pressure in the chamber to a set value using a pressure adjusting valve based on a measured value obtained by measuring pressure in the chamber using a manometer; and (d) irradiating the substrate housed in the chamber with light emitted from a light irradiation part through the quartz window, wherein if a time period in which a difference between a measured value obtained by the manometer and the set value is a certain value or more exceeds a threshold set in advance after pressure in the chamber is reduced to treatment pressure, a leak is determined to occur at the chamber.

The occurrence of a leak is determined by monitoring pressure deviation occurring during pressure reduction process. This makes it possible to determine the presence or absence of a leak at the chamber with a simple structure.

According to a different aspect of the present invention, the heat treatment method comprises the steps of: (a) housing the substrate in a chamber having a quartz window; (b) reducing pressure in the chamber to a level less than atmospheric pressure; and (c) irradiating the substrate housed in the chamber with light emitted from a light irradiation part through the quartz window, wherein if a time period required for pressure in the chamber to reach atmospheric pressure since start of supply of inert gas to the chamber reduced to predetermined pressure is less than a threshold set in advance, a leak is determined to occur at the chamber.

The occurrence of a leak is determined by monitoring a time period of increase to atmospheric pressure. This makes it possible to determine the presence or absence of a leak at the chamber with a simple structure.

It is therefore an object of the present invention to determine the presence or absence of a leak at the chamber with a simple structure.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal sectional view showing the configuration of a heat treatment apparatus according to the present invention;

FIG. 4 is a sectional view of the susceptor;

FIG. 5 is a plan view of a transfer mechanism;

FIG. 6 is a side view of the transfer mechanism;

DESCRIPTION OF THE PREFERRED EMBODIMENTS

Figure 2:
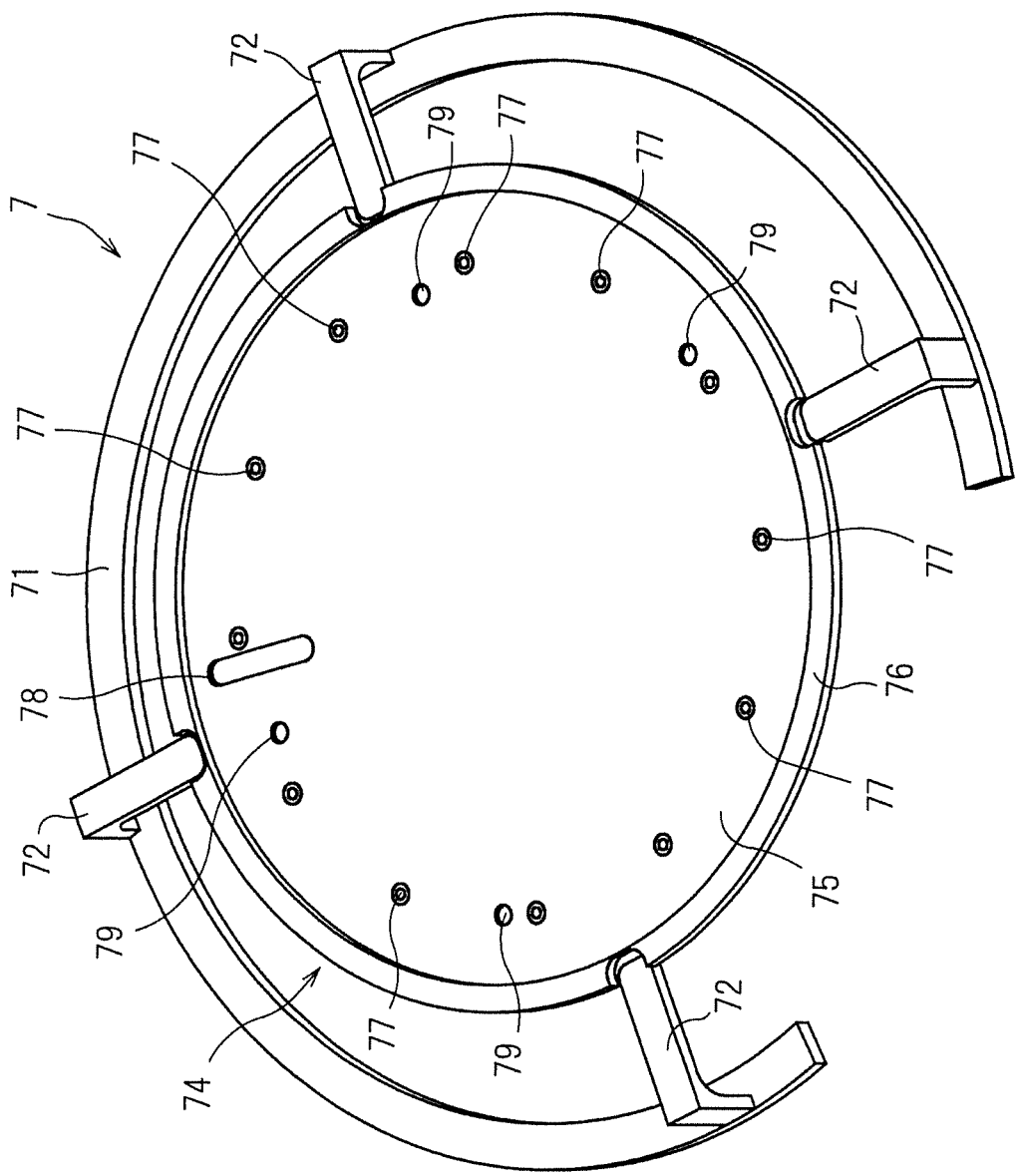
FIG. 2 is a perspective view showing the entire external appearance of a holder.

Preferred embodiments according to the present invention will now be described in detail with reference to the drawings.

First Preferred Embodiment

FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm or 450 mm (in this preferred embodiment, 300 mm). The semiconductor wafer W before being transported into the heat treatment apparatus 1 includes a high dielectric constant film (high-k film) formed as a gate insulator film. The heat treatment apparatus 1 performs heat treatment to thereby perform post deposition annealing (PDA) on the high dielectric constant film. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured in such a manner that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a bored therein. A radiation thermometer 20 is mounted to a location of an outer wall surface of the chamber side portion 61 where the through hole 61a is provided. The through hole 61a is a cylindrical hole for directing infrared radiation emitted from the lower surface of a semiconductor wafer W held by a susceptor 74 to be described later therethrough to the radiation thermometer 20. The through hole 61a is inclined with respect to a horizontal direction so that a longitudinal axis (an axis extending in a direction in which the through hole 61a extends through the chamber side portion 61) of the through hole 61a intersects a main surface of the semiconductor wafer W held by the susceptor 74. A transparent window 21 made of a barium fluoride material transparent to infrared radiation in a wavelength range measurable with the radiation thermometer 20 is mounted to an end portion of the through hole 61a which faces the heat treatment space 65.

A gas supply opening 81 for supplying treatment gas (in this preferred embodiment, nitrogen gas ($N_2$) and ammonia ($NH_3$)) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. The treatment gas supply source 85 supplies nitrogen gas or mixed gas containing ammonia and nitrogen gas as treatment gas to the gas supply pipe 83 under control by the controller 3. A supply valve 84 and a flow rate adjusting valve 90 are inserted at some midpoints in the gas supply pipe 83. When the supply valve 84 is opened, the treatment gas is supplied from the treatment gas supply source 85 to the buffer space 82. The flow rate of the treatment gas flowing through the gas supply pipe 83 to be supplied to the buffer space 82 is adjusted by the flow rate adjusting valve 90. The flow rate of the treatment gas determined by the flow rate adjusting valve 90 is changeable under control by the controller 3. The treatment gas flowing in the buffer space 82 flows in a spreading manner within the buffer space 82 which is lower in fluid resistance than the gas supply opening 81, and is supplied through the gas supply opening 81 into the heat treatment space 65. The treatment gas supply source 85, the supply valve 84, and the flow rate adjusting valve 90 form a gas supply part 180 to supply predetermined treatment gas into the chamber 6. The treatment gas is not limited to nitrogen gas or ammonia but may be inert gas such as argon (Ar) or helium (He), or reactive gas such as oxygen ($O_2$), hydrogen ($H_2$), chlorine ($Cl_2$), hydrogen chloride (HCl), ozone ($O_3$), nitrogen monoxide (NO), nitrous oxide ($N_2O$), or nitrogen dioxide ($NO_2$), for example.

A gas exhaust opening 86 for exhausting gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190.

Figure 8:
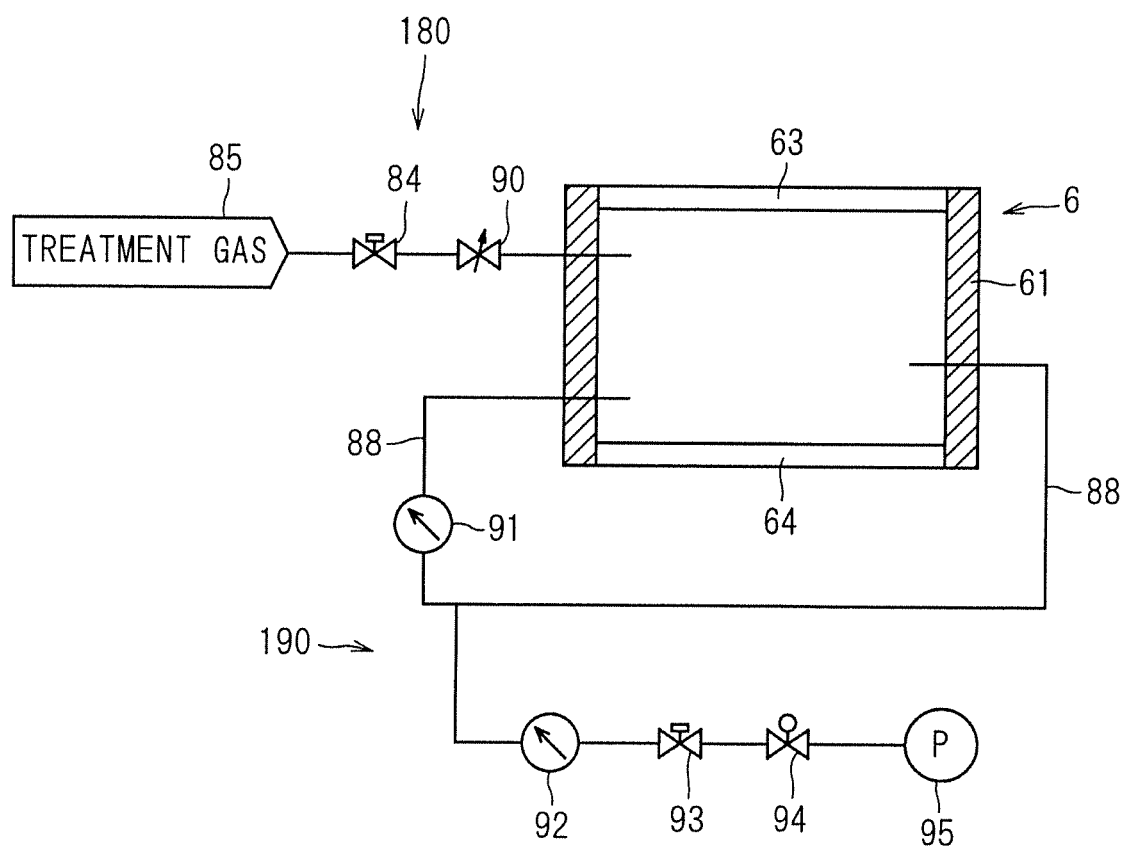
FIG. 8 shows a supply and exhaust mechanism for the chamber.
Figure 8:
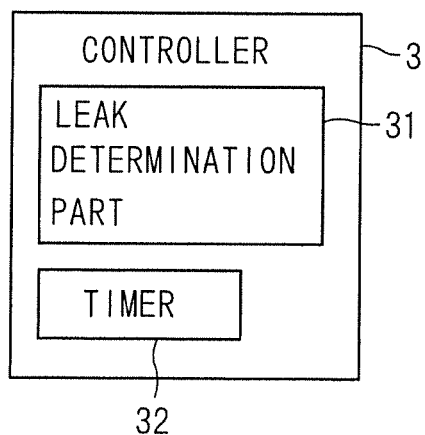

FIG. 8 shows a supply and exhaust mechanism for the chamber 6. The exhaust part 190 includes an automatic adjusting valve manometer 91, a vacuum manometer 92, an exhaust valve 93, an automatic pressure adjusting valve 94, and a vacuum pump 95. As shown in FIG. 8, the gas exhaust pipes 88 are connected to two positions of the chamber 6, a position closer to the transport opening 66 and a position on the opposite side (only one gas exhaust pipe 88 is shown in FIG. 1). These two gas exhaust pipes 88 are combined into one and connected to the vacuum pump 95. The automatic adjusting valve manometer 91, the vacuum manometer 92, the exhaust valve 93, and the automatic pressure adjusting valve 94 are provided at some midpoints in the gas exhaust pipe 88.

The vacuum pump 95 is a pump usable in reducing pressure in the chamber 6 at least to 100 Pa or less through the gas exhaust pipe 88. The exhaust valve 93 is a solenoid valve, for example, and is used for opening and closing a channel in the gas exhaust pipe 88. When the exhaust valve 93 is opened while the vacuum pump 95 is in operation, an atmosphere in the chamber 6 is sucked through the gas exhaust opening 86 to be exhausted into the gas exhaust pipe 88 through the buffer space 87. The vacuum manometer 92 measures pressure in the chamber 6 by measuring the pressure of the gas exhaust pipe 88.

The automatic adjusting valve manometer 91 and the automatic pressure adjusting valve 94 work cooperatively to maintain pressure in the chamber 6 at a predetermined value. The automatic adjusting valve manometer 91 also measures pressure in the chamber 6 by measuring the pressure of the gas exhaust pipe 88. The automatic pressure adjusting valve 94 receives a set value (command value) about pressure in the chamber 6 given from the controller 3. While the exhaust valve 93 is opened and the vacuum pump 95 is in operation, the automatic adjusting valve manometer 91 measures pressure in the chamber 6. Based on a resultant measured value, the automatic pressure adjusting valve 94 controls a degree of opening of the automatic pressure adjusting valve 94 to adjust pressure in the chamber 6 at the set value. Specifically, the automatic pressure adjusting valve 94 uses a result of measurement about pressure in the chamber 6 obtained by the automatic adjusting valve manometer 91 as feedback to control a degree of opening of the automatic pressure adjusting valve 94 so that that pressure in the chamber 6 is at the set value.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in this preferred embodiment, four coupling portions 72) are mounted upright on the upper surface of the base ring 71 and arranged in a circumferential direction of the annular shape thereof. The coupling portions 72 are also quartz members, and are rigidly secured to the base ring 71 by welding.

Figure 3:
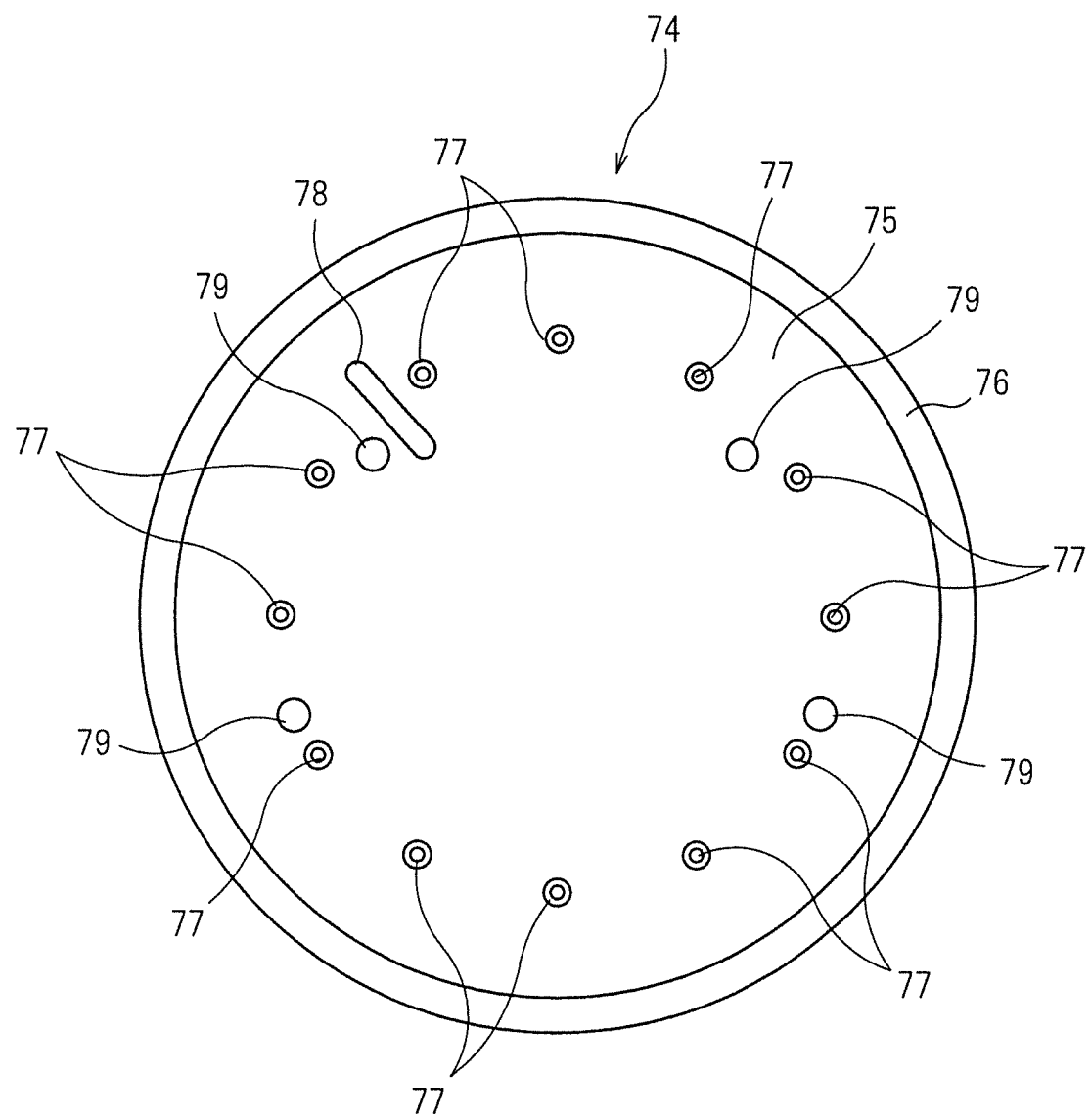
FIG. 3 is a plan view of a susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, if the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In this preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is from 270 to 280 mm (in this preferred embodiment, 270 mm) if the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is provided for the radiation thermometer 20 to receive radiation (infrared radiation) emitted from the lower surface of the semiconductor wafer W. Specifically, the radiation thermometer 20 receives the radiation emitted from the lower surface of the semiconductor wafer W through the opening 78 and the transparent window 21 mounted to the through hole 61a in the chamber side portion 61 to measure the temperature of the semiconductor wafer W. The holding plate 75 of the susceptor 74 further includes four through holes 79 bored therein and designed so that lift pins 12 of the transfer mechanism 10 to be described later pass through the through holes 79, respectively, to transfer a semiconductor wafer W.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7, and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in this preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane. A region in which the flash lamps FL are arranged has a size, as seen in plan view, greater than that of the semiconductor wafer W.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in this preferred embodiment, 40) halogen lamps HL.

The halogen heating part 4 directs light from under the chamber 6 through the lower chamber window 64 toward the heat treatment space 65 to heat the semiconductor wafer W by means of the halogen lamps HL.

Figure 7:
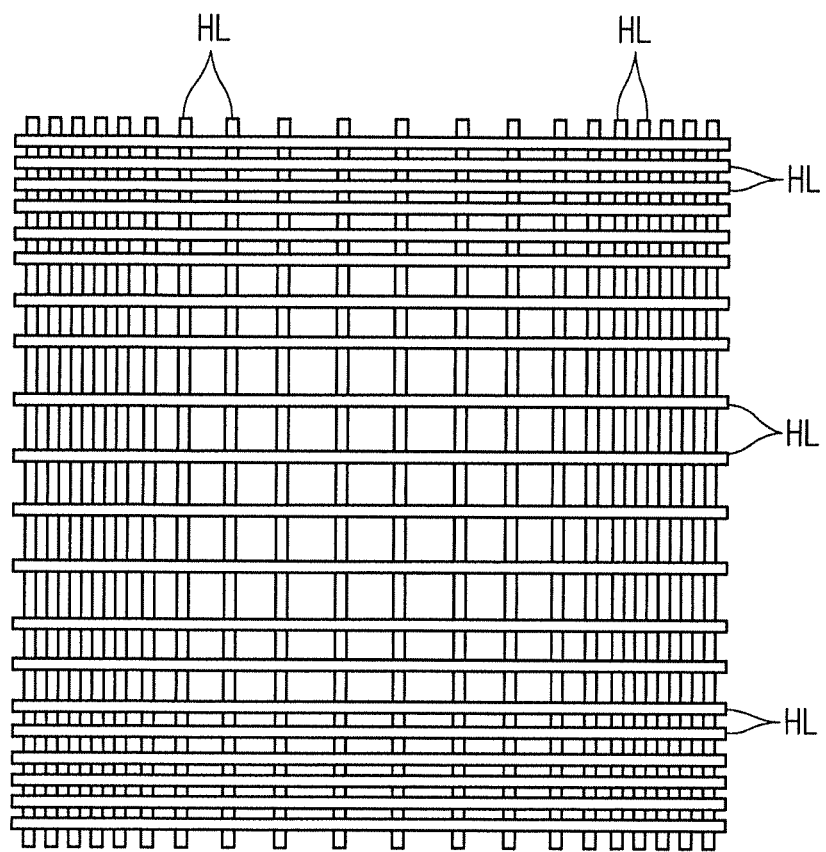
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into inert gas such as nitrogen, argon and the like is sealed in the glass tube. The introduction of the halogen element allows the temperature of the filament to be set at a high temperature while suppressing a break in the filament. Thus, the halogen lamps HL have the properties of having a long life and being capable of continuously emitting intense light, compared with typical incandescent lamps. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the foregoing various operating mechanisms provided in the heat treatment apparatus 1. The controller 3 is similar in hardware structure to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. As shown in FIG. 8, the controller 3 includes a leak determination part 31 and a timer 32. The leak determination part 31 is a functional processor to be realized by execution of a predetermined processing program by the CPU in the controller 3. The timer 32 has a time keeping function. The details of process by the leak determination part 31 will be described later.

The heat treatment apparatus 1 further includes, in addition to the foregoing components, various cooling structures to prevent an excessive temperature rise in the halogen heating part 4, the flash heating part 5 and the chamber 6 because of the heat energy generated from the halogen lamps HL and the flash lamps FL during the heat treatment on a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment on a semiconductor wafer W in the heat treatment apparatus 1 will be described. A semiconductor wafer W to be treated herein is a silicon semiconductor substrate with a high dielectric constant film formed as a gate insulator film. The high dielectric constant film is deposited to become a film on the front surface of the semiconductor wafer W by a technique such as atomic layer deposition (ALD) or metal organic chemical vapor deposition (MOCVD), for example. The heat treatment apparatus 1 irradiates the semiconductor wafer W with a flash of light in an ammonia atmosphere and performs post deposition annealing (PDA), thereby eliminating a defect in the deposited high dielectric constant film. The procedure for the treatment in the heat treatment apparatus 1 described below proceeds under control by the controller 3 over the operating mechanisms of the heat treatment apparatus 1.

First, the semiconductor wafer W with the high dielectric constant film is transported into the chamber 6 of the heat treatment apparatus 1. For incoming transport of the semiconductor wafer W, the gate valve 185 is opened and the transport opening 66 is opened. Then, a transport robot outside the apparatus transports the semiconductor wafer W with the high dielectric constant film into the heat treatment space 65 in the chamber 6 through the transport opening 66. At this time, both the outside and the interior of the chamber 6 are placed at atmospheric pressure. Thus, as a result of the incoming transport of the semiconductor wafer W, an atmosphere outside the apparatus is taken into the heat treatment space 65 in the chamber 6. In this regard, nitrogen gas may be supplied continuously from the treatment gas supply source 85 into the chamber 6 by opening the supply valve 84 to make a nitrogen gas flow get out of the chamber 6 through the transport opening 66, thereby minimizing flow of the atmosphere outside the apparatus into the chamber 6. While the gate valve 185 is opened, exhaustion from the chamber 6 is preferably stopped by closing the exhaust valve 93. This causes the nitrogen gas supplied into the chamber 6 to flow out of the chamber 6 only through the transport opening 66, thereby preventing incoming flow of the outside atmosphere more effectively.

The semiconductor wafer W transported into the heat treatment space 65 by the transport robot is moved forward to a position immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the susceptor 74 in such an attitude that the front surface thereof on which the high dielectric constant film is deposited becomes an upper surface. A predetermined distance is defined between the back surface (a main surface opposite the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

Figure 9:
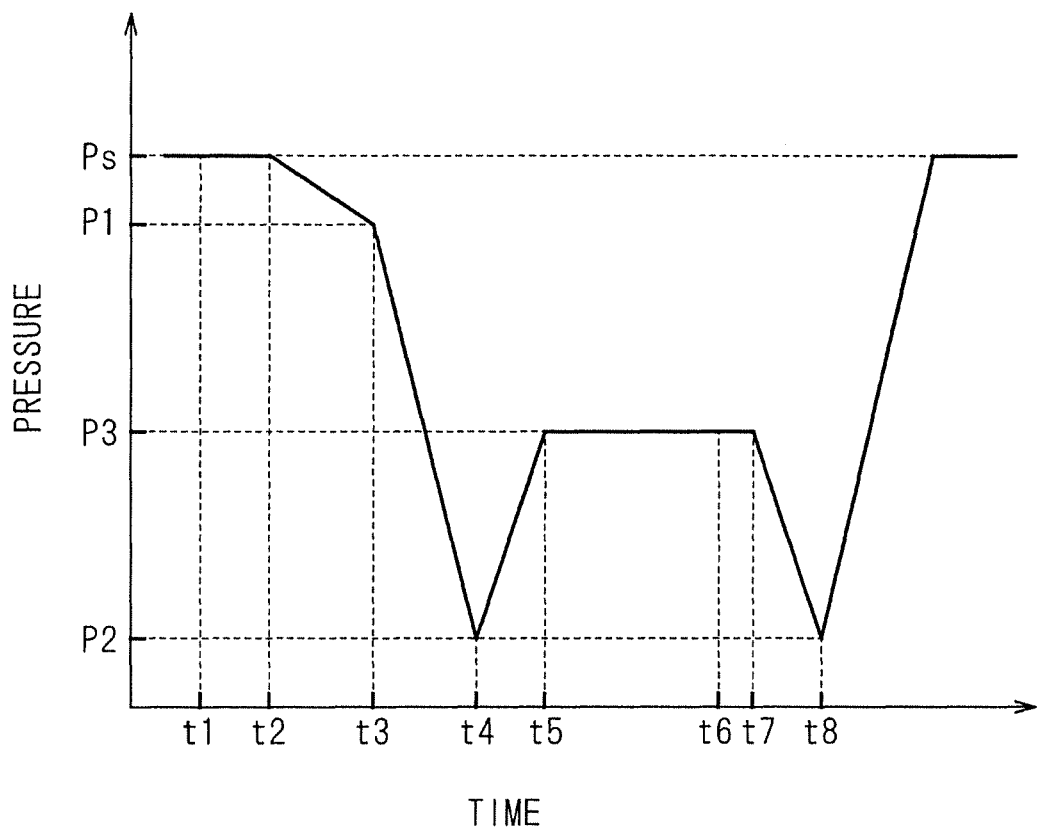
FIG. 9 shows pressure change in the chamber.

After the semiconductor wafer W is housed in the chamber 6 and the transport opening 66 is closed by the gate valve 185, pressure in the chamber 6 is reduced to pressure less than atmospheric pressure. FIG. 9 shows pressure change in the chamber 6. At time t1, the semiconductor wafer W is transported into the chamber 6 at atmospheric pressure Ps (about 101325 Pa). Then, the transport opening 66 is closed by the gate valve 185. By doing so, the heat treatment space 65 in the chamber 6 becomes hermetically-sealed space. While this state is maintained, the controller 3 operates the vacuum pump 95 and opens the exhaust valve 93 at time t2, thereby sucking an atmosphere in the chamber 6 through the gas exhaust opening 86 and exhausting the sucked atmosphere to the gas exhaust pipe 88. Further, the controller 3 closes the supply valve 84 for supply of gas. By doing so, the exhaustion proceeds while gas is not supplied into the chamber 6, thereby reducing the pressure of the heat treatment space 65 in the chamber 6.

In a time period from the time t2 to time t3, the controller 3 exhausts gas at a relatively low exhaust flow rate to reduce pressure to P1 (about 20000 Pa, for example) by controlling the automatic pressure adjusting valve 94. Then, the controller 3 increases an exhaust flow rate at the time t3. Specifically, the controller 3 exhausts gas at a low exhaust flow rate in an initial stage of pressure reduction. The controller 3 employs a higher exhaust flow rate for subsequent exhaustion. If exhaustion proceeds rapidly at a high exhaust flow rate from the start of the pressure reduction, large gas flow change may occur in the chamber 6 and particles adhering to a component of the chamber 6 (lower chamber window 64, for example) may swirl up to again adhere to the semiconductor wafer W, causing the risk of contamination of the semiconductor wafer W. Exhausting gas gently at a low exhaust flow rate in the initial stage of the pressure reduction and then employing a higher exhaust flow rate for subsequent exhaustion allows prevention of the occurrence of such swirling up of particles in the chamber 6.

At time t4, pressure (degree of vacuum) in the chamber 6 reaches pressure P2. The pressure P2 is about 100 Pa, for example. The supply valve 84 for supply of gas is opened at the time t4 when pressure in the chamber 6 has reached the pressure P2 to supply mixed gas containing ammonia and nitrogen gas as diluent gas from the treatment gas supply source 85 into the heat treatment space 65 in the chamber 6. As a result, an ammonia atmosphere is formed around the semiconductor wafer W held by the holder 7 in the chamber 6. The concentration of ammonia in the ammonia atmosphere (specifically, a mixture ratio between ammonia and nitrogen gas) is not particularly limited but is settable appropriately at a level such as about 10 vol. % or less, for example (in this preferred embodiment, about 2.5 vol. %).

As a result of supply of the mixed gas into the chamber 6, pressure in the chamber 6 increases from the pressure P2 to pressure P3 at time t5. The pressure P3 at which the semiconductor wafer W is to be treated is higher than the pressure P2 and less than the atmospheric pressure Ps. The pressure P3 is about 5000 Pa, for example. Pressure in the chamber 6 is reduced once to the pressure P2 and then increased to the pressure P3. This allows an oxygen concentration in the ammonia atmosphere in the chamber 6 after the pressure increase not to exceed about 200 ppb.

In a time period after the time t5 when pressure in the chamber 6 has increased to the pressure P3, pressure in the chamber 6 is maintained at the pressure P3 by supplying the mixed gas containing ammonia and nitrogen into the chamber 6 and exhausting gas from the chamber 6 at respective flow rates substantially equal to each other. To maintain pressure in the chamber 6 at the pressure P3 less than atmospheric pressure (in a time period from the time t5 to time t7), the controller 3 gives the pressure P3 to the automatic pressure adjusting valve 94 as a set value (command value) about pressure in the chamber 6. The automatic pressure adjusting valve 94 uses a result of measurement about pressure in the chamber 6 obtained by the automatic adjusting valve manometer 91 as feedback to control a degree of opening of the automatic pressure adjusting valve 94 so that pressure in the chamber 6 is at the set value (pressure P3).

In a time period after the time t5 when pressure in the chamber 6 has increased to the pressure P3, the 40 halogen lamps HL in the halogen heating part 4 turn on simultaneously to start preheating (or assist-heating) on the semiconductor wafer W. Halogen light emitted from the halogen lamps HL is transmitted through the lower chamber window 64 both made of quartz, and impinges upon the back surface of the semiconductor wafer W. By receiving the halogen light irradiation from the halogen lamps HL, the semiconductor wafer W is preheated to increase in temperature. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the preheating. Specifically, the radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while checking to see whether the temperature of the semiconductor wafer W being increased by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 20. The preheating temperature T1 shall be from 300° to 600° C., preferably 450° C. in this preferred embodiment.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in the peripheral portion thereof where heat dissipation is liable to occur than in the central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Pressure in the chamber 6 in the preheating stage is maintained at the pressure P3.

Next, the flash lamps FL in the flash heating part 5 irradiate the front surface of the semiconductor wafer W held by the susceptor 74 with flashes of light at time t6 when a predetermined time period has passed since the temperature of the semiconductor wafer W reached the preheating temperature T1. At this time, some of the flashes of light emitted from the flash lamps FL travel directly toward the interior of the chamber 6. The other flashes of light are reflected once from the reflector 52, and then travel toward the interior of the chamber 6. The irradiation with such flashes of light achieves the flash heating of the semiconductor wafer W.

The flash heating, which is achieved by the emission of flashes of light from the flash lamps FL, is capable of increasing the temperature of the front surface of the semiconductor wafer W in a short time. Specifically, the flashes of light emitted from the flash lamps FL are intense flashes of light emitted for an extremely short period of time ranging from about 0.1 to about 100 milliseconds as a result of the conversion of the electrostatic energy previously stored in the capacitor into such an ultrashort light pulse. Irradiating the front surface of the semiconductor wafer W on which the high dielectric constant film is deposited with the flashes of light emitted from the flash lamps FL increases the temperature of the front surface of the semiconductor wafer W with the high dielectric constant film momentarily to a treatment temperature T2, thereby performing post deposition annealing. The treatment temperature T2 means a maximum temperature (peak temperature) to be reached by the front surface of the semiconductor wafer W by the irradiation of flashes of light, and is from 600 to 1200 C.°. In this preferred embodiment, the treatment temperature T2 is 1000 C.°.

As a result of temperature increase of the front surface of the semiconductor wafer W to the treatment temperature T2 in the ammonia atmosphere and implementation of the post deposition annealing, nitriding of the high dielectric constant film is facilitated and a defect such as a point defect in the high dielectric constant film disappears. Emission from the flash lamps FL lasts in an extremely short period of time ranging from about 0.1 to about 100 milliseconds. Thus, increasing the temperature of the front surface of the semiconductor wafer W from the preheating temperature T1 to the treatment temperature T2 also requires an extremely short period of time of less than one second. Immediately after the irradiation with the flashes of light, the temperature of the front surface of the semiconductor wafer W decreases rapidly from the treatment temperature T2.

At the time t7 when a predetermined time period has passed since the completion of the flash heating treatment, the controller 3 closes the supply valve 84 and reduces pressure in the chamber 6 again to the pressure P2. This allows discharge of harmful ammonia from the heat treatment space 65 in the chamber 6. At subsequent time t8 when pressure in the chamber 6 has reached the pressure P2, the controller 3 closes the exhaust valve 93 and opens the supply valve 84 to supply nitrogen gas as inert gas into the chamber 6 from the treatment gas supply source 85, thereby increasing pressure in the chamber 6 to the atmospheric pressure Ps. Further, the halogen lamps HL turn off. This causes the temperature of the semiconductor wafer W to decrease from the preheating temperature T1. The radiation thermometer 20 measures the temperature of the semiconductor wafer W which is on the decrease. A result of the measurement is transmitted to the controller 3. The controller 3 checks to see whether the temperature of the semiconductor wafer W has decreased to a predetermined temperature or not, based on the result of the measurement with the radiation thermometer 20. After an atmosphere in the chamber 6 is replaced by a nitrogen atmosphere to increase pressure in the chamber 6 to the atmospheric pressure Ps and the temperature of the semiconductor wafer W is decreased to the predetermined temperature or less, the pair of transfer arms 11 of the transfer mechanism 10 is moved horizontally again from the retracted position to the transfer operation position and is then moved upwardly. By doing so, the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. In this way, the heat treatment apparatus 1 completes the heat treatment on the semiconductor wafer W.

In the heat treatment apparatus 1 of this preferred embodiment, for atmosphere replacement, pressure in the chamber 6 is reduced to the pressure P2 (about 100 Pa) and the heat treatment on the semiconductor wafer W proceeds in a reduced-pressure atmosphere of the pressure P3 (about 5000 Pa). Further, ammonia as reactive gas is supplied into the chamber 6. Hence, the occurrence of a leak at the chamber 6 causes not only the risk of failing to reduce pressure in the chamber 6 to a predetermined pressure but also the risk of leakage of harmful ammonia. In this regard, determining the presence or absence of a leak at the chamber 6 becomes an important issue.

In the first preferred embodiment, the presence or absence of a leak is determined by monitoring a time period passed since start of reduction of pressure in the chamber 6. More specifically, if pressure in the chamber 6 does not reach target pressure while a time period passed since start of reduction of pressure in the chamber 6 exceeds a threshold set in advance, the leak determination part 31 determines that a leak occurs at the chamber 6. A time period passed since start of reduction of pressure in the chamber 6 is measured by the timer 32. The controller 3 includes the threshold for leak determination set in advance (in the first preferred embodiment, 50 seconds, for example). Pressure in the chamber 6 is measured by the vacuum manometer 92.

In the foregoing example, reduction of pressure in the chamber 6 is started at the time t2. In the absence of a leak, pressure in the chamber 6 is to reach the pressure P1 as initial target pressure at the time t3 about 18 seconds later, for example. In the presence of a leak at the chamber 6, however, a long time period is required from start of reduction of pressure in the chamber 6 to attainment of the target pressure. In another case, if the amount of leakage is large compared to an exhaust flow rate, it may inherently be impossible for pressure in the chamber 6 to reach the target pressure. Then, if pressure in the chamber 6 measured by the vacuum manometer 92 does not reach the pressure P1 as the target pressure while a time period passed since the time t2 when reduction of pressure in the chamber 6 is started exceeds the threshold set in advance (50 seconds, for example), the leak determination part 31 determines that a leak occurs at the chamber 6.

In the foregoing example, an exhaust flow rate is changed and pressure reduction proceeds in two stages. Reduction of pressure in the chamber 6 in the second stage is started at the time t3. In the absence of a leak, pressure in the chamber 6 is to reach the pressure P2 as final target pressure at the time t4 about 14 seconds later. Like in the foregoing case, if pressure in the chamber 6 measured by the vacuum manometer 92 does not reach the pressure P2 as the target pressure while a time period passed since the time t3 when reduction of pressure in the chamber 6 is started exceeds the threshold set in advance (50 seconds, for example), the leak determination part 31 determines that a leak occurs at the chamber 6.

A leak may occur at the chamber 6 for a reason such as damage of the upper chamber window 63 and/or lower chamber window 64 (crack or fissure, for example), degradation of a seal between the upper chamber window 63 and/or lower chamber window 64 and the chamber side portion 61, or loosening of a joint of supply and exhaust piping connected to the chamber 6, for example. If the leak determination part 31 determines that a leak occurs at the chamber 6, the controller 3 stops the treatment on a semiconductor wafer W by the heat treatment apparatus 1. Then, maintenance work of the heat treatment apparatus 1 is conducted to resolve a cause for the leak.

In the first preferred embodiment, if pressure in the chamber 6 does not reach the target pressure while a time period passed since start of reduction of pressure in the chamber 6 exceeds the threshold set in advance, a leak is determined to occur at the chamber 6. Specifically, a leak at the chamber 6 is detected by monitoring a time period passed since start of reduction of pressure in the chamber 6. This makes it possible to determine the presence or absence of a leak at the chamber 6 with a simple structure without requiring installation of a new hardware structure.

Second Preferred Embodiment

A second preferred embodiment of the present invention will be described next. A heat treatment apparatus 1 of the second preferred embodiment has a configuration exactly the same as that of the first preferred embodiment. The heat treatment apparatus 1 of the second preferred embodiment follows a procedure also similar to that of the first preferred embodiment. The second preferred embodiment differs from the first preferred embodiment in a way of determining the presence or absence of a leak at the chamber 6.

In the second preferred embodiment, the presence or absence of a leak is determined by monitoring pressure deviation occurring during pressure reduction process on a semiconductor wafer W. More specifically, if a time period in which a difference between a measured value obtained by the automatic adjusting valve manometer 91 and a set value given to the automatic pressure adjusting valve 94 is a certain value or more exceeds a threshold set in advance after pressure in the chamber 6 is reduced to treatment pressure, the leak determination part 31 determines that a leak occurs at the chamber 6.

Referring to FIG. 9, in a time period from the time t5 to the time t7, mixed gas containing ammonia and nitrogen is supplied from the gas supply part 180 into the chamber 6 and an atmosphere in the chamber 6 is exhausted by the exhaust part 190, thereby maintaining pressure in the chamber 6 at the pressure P3 at which a semiconductor wafer W is to be treated. In a time period after pressure in the chamber 6 is reduced to the treatment pressure (pressure P3) (specifically, in a time period after the time t5), the treatment gas is supplied into the chamber 6 and gas is exhausted from the chamber 6 at flow rates substantially equal to each other. Further, the pressure P3 is given as a set value (command value) about pressure in the chamber 6 from the controller 3 to the automatic pressure adjusting valve 94. The automatic pressure adjusting valve 94 uses a result of measurement about pressure in the chamber 6 obtained by the automatic adjusting valve manometer 91 as feedback to control a degree of opening of the automatic pressure adjusting valve 94 so that pressure in the chamber 6 is at the set value (pressure P3).

In the second preferred embodiment, in a time period after the time t5, the leak determination part 31 acquires a difference between a measured value Px obtained by the automatic adjusting valve manometer 91 and a set value Pc given to the automatic pressure adjusting valve 94 as pressure deviation Pd. In a strict sense, as indicated by the following formula (1), the pressure deviation Pd is a value obtained by subtracting the set value Pc given to the automatic pressure adjusting valve 94 from the measured value Px obtained by the automatic adjusting valve manometer 91:

$$Pd = Px - Pc \tag{1}$$

In the absence of a leak at the chamber 6, the pressure deviation Pd is to become substantially zero. In the foregoing example, the set value Pc given to the automatic pressure adjusting valve 94 is 5000 Pa. In the absence of a leak at the chamber 6, the measured value Px obtained by the automatic adjusting valve manometer 91 is to approach 5000 Pa to make the pressure deviation Pd substantially zero, for example. By contrast, on the occurrence of a leak at the chamber 6, the measured value Px obtained by the automatic adjusting valve manometer 91 always becomes larger than the set value Pc. Hence, the pressure deviation Pd does not become zero. If the measured value Px obtained by the automatic adjusting valve manometer 91 is 7000 Pa, for example, the leak determination part 31 calculates the pressure deviation Pd to 2000 Pa.

Next, if a time period in which the following formula (2) is satisfied continuously exceeds a threshold set in advance, the leak determination part 31 determines that a leak occurs at the chamber 6. In the formula (2), "a" is a determination factor for determining a leak and is set in advance at the controller 3. Determination is made more strictly with reduction in the determination factor a. A time period in which the formula (2) is satisfied continuously is measured by the timer 32. The threshold for leak determination is set in advance at the controller 3 (in the second preferred embodiment, five seconds, for example).

$$Pd > a \cdot Pc \quad (2)$$

The formula (2) means that the pressure deviation Pd between the measured value Px obtained by the automatic adjusting valve manometer 91 and the set value Pc given to the automatic pressure adjusting valve 94 is a certain value or more. Specifically, if a time period in which the pressure deviation Pd between the measured value Px obtained by the automatic adjusting valve manometer 91 and the set value Pc given to the automatic pressure adjusting valve 94 is a certain value or more exceeds the threshold set in advance, the leak determination part 31 determines that a leak occurs at the chamber 6.

It is assumed, for example, that the determination factor a is set at 0.2. The set value Pc given to the automatic pressure adjusting valve 94 is 5000 Pa. Thus, if a time period in which the pressure deviation Pd is continuously 1000 Pa or more exceeds the threshold set in advance (five seconds, for example), the leak determination part 31 determines that a leak occurs at the chamber 6. If the measured value Px obtained by the automatic adjusting valve manometer 91 continuously takes 7000 Pa for a time period exceeding five seconds, for example, the leak determination part 31 determines that a leak occurs at the chamber 6.

In the second preferred embodiment, if a time period in which a difference between a measured value obtained by the automatic adjusting valve manometer 91 and a set value given to the automatic pressure adjusting valve 94 is a certain value or more exceeds the threshold set in advance after pressure in the chamber 6 is reduced to the treatment pressure, a leak is determined to occur at the chamber 6. Specifically, a leak at the chamber 6 is detected by monitoring pressure deviation occurring during pressure reduction process on a semiconductor wafer W. This makes it possible to determine the presence or absence of a leak at the chamber 6 with a simple structure without requiring installation of a new hardware structure.

Third Preferred Embodiment

A third preferred embodiment of the present invention will be described next. A heat treatment apparatus 1 of the third preferred embodiment has a configuration exactly the same as that of the first preferred embodiment. The heat treatment apparatus 1 of the third preferred embodiment follows a procedure also similar to that of the first preferred embodiment. The third preferred embodiment differs from the first preferred embodiment in a way of determining the presence or absence of a leak at the chamber 6.

In the third preferred embodiment, the presence or absence of a leak is determined by monitoring a time period of increase of pressure in the chamber 6 to atmospheric pressure. More specifically, if a time period required for pressure in the chamber 6 to reach the atmospheric pressure Ps since start of supply of inert gas into the chamber 6 reduced to predetermined pressure is less than a threshold set in advance, the leak determination part 31 determines that a leak occurs at the chamber 6. A time period required for pressure in the chamber 6 to reach the atmospheric pressure Ps since start of supply of inert gas into the chamber 6 in a reduced-pressure state is measured by the timer 32. The threshold for leak determination is set in advance at the controller 3 (in the third preferred embodiment, three seconds, for example). Pressure in the chamber 6 is measured by the vacuum manometer 92.

In the illustration of FIG. 9, the gas supply part 180 starts supply of nitrogen gas as inert gas at a constant flow rate (95 liters per minute, for example) at the time t8 into the chamber 6 reduced to the pressure P2. In the absence of a leak, pressure in the chamber 6 is to be increased to the atmospheric pressure Ps about 13.5 seconds later. By contrast, on the occurrence of a leak at the chamber 6, pressure in the chamber 6 is to return to the atmospheric pressure Ps extremely rapidly. If a time period required for pressure in the chamber 6 to reach the atmospheric pressure Ps since the time t8 when supply of inert gas into the chamber 6 is started is less than the threshold set in advance (three seconds, for example), the leak determination part 31 determines that a leak occurs at the chamber 6.

In the third preferred embodiment, if a time period required for pressure in the chamber 6 to reach the atmospheric pressure Ps since start of supply of inert gas into the chamber 6 reduced to predetermined pressure is less than the threshold set in advance, a leak is determined to occur at the chamber 6. Specifically, a leak at the chamber 6 is detected by monitoring a time period of increase of pressure in the chamber 6 to atmospheric pressure. This makes it possible to determine the presence or absence of a leak at the chamber 6 with a simple structure without requiring installation of a new hardware structure.

Modifications

While the preferred embodiments according to the present invention have been described hereinabove, various modifications of the present invention in addition to those described above may be made without departing from the scope and spirit of the invention. For example, each threshold for leak determination set in each of the foregoing preferred embodiments may have an appropriate value responsive to the configuration or specifications of the apparatus.

In each of the foregoing preferred embodiments, an ammonia atmosphere is formed in the chamber 6. However, even if an atmosphere of reactive gas such as ammonia is not formed in the chamber 6 (if a nitrogen atmosphere is formed in the chamber 6, for example), the technique according to the present invention is still applicable. Meanwhile, the technique according to the present invention is preferably applicable to a case where an atmosphere to be formed in the chamber 6 is an atmosphere of reactive gas to become harmful if leaking out of the chamber 6.

While the 30 flash lamps FL are provided in the flash heating part 5 in the foregoing preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the foregoing preferred embodiments, the filament-type halogen lamps HL are used as continuous lighting lamps that emit light continuously for not less than one second to preheat a semiconductor wafer W. The present invention, however, is not limited to this. In place of the halogen lamps HL, discharge type arc lamps (e.g., xenon arc lamps) may be used as continuous lighting lamps to preheat the semiconductor wafer W.

Moreover, a substrate to be treated by the heat treatment apparatus 1 is not limited to a semiconductor wafer, but may be a glass substrate for use in a flat panel display for a liquid crystal display apparatus and the like, and a substrate for a solar cell.

Also, the technique according to the present invention is not limited to the flash lamp annealer, but is also applicable to single-wafer type lamp annealers employing halogen lamps or laser annealers employing other light sources, as long as such apparatuses are intended to reduce pressure in a chamber. The technique according to the present invention is further applicable to heat treatment apparatuses employing heat sources other than light irradiation such as a heat treatment apparatus employing a hot plate, as long as such apparatuses are intended to reduce pressure in a chamber. Additionally, the applicability of the technique according to the present invention is not limited to heat treatment apparatuses but may widely cover apparatuses to treat a semiconductor wafer W by reducing pressure in a chamber.

While the invention has been described in detail, the foregoing description is in all aspects illustrative and not restrictive. It is therefore understood that numerous modifications and variations can be devised without departing from the scope of the invention.

What is claimed is:

1. A heat treatment method for heating a substrate by irradiating the substrate with light, comprising the steps of:
   (a) housing said substrate in a chamber having a quartz window;
   (b) reducing pressure in said chamber to a level less than atmospheric pressure;
   (c) irradiating said substrate housed in said chamber with light emitted from a light irradiation part through said quartz window; and
   (d) determining that a leak occurs in said chamber when the pressure in said chamber reaches to the atmospheric pressure from the reduced pressure within less than a threshold time period.

2. The heat treatment method according to claim 1, wherein
   in said step (c), said substrate is irradiated with a flash of light emitted from a flash lamp.

\* \* \* \* \*